United States Patent [19]
Williamson, III et al.

[11] Patent Number: 5,815,008
[45] Date of Patent: *Sep. 29, 1998

[54] RESONANT TUNNELING DIODE STRUCTURES FOR FUNTIONALLY COMPLETE LOW-POWER LOGIC

[75] Inventors: William Williamson, III; Barry Kent Gilbert, both of Rochester, Minn.

[73] Assignee: Mayo Foundation for Medical Education and Research, Rochester, Minn.

[*] Notice: The term of this patent shall not extend beyond the expiration date of Pat. No. 5,698,997.

[21] Appl. No.: 869,547

[22] Filed: Jun. 5, 1997

Related U.S. Application Data

[63] Continuation of Ser. No. 534,955, Sep. 28, 1995, Pat. No. 5,698,997.

[51] Int. Cl.$^6$ .......................... H03K 19/10; H03K 19/01
[52] U.S. Cl. .............................. 326/134; 326/93; 326/17; 327/200; 327/499
[58] Field of Search .......................... 326/132, 134–135, 326/17, 93; 327/199–200, 499–500

[56] References Cited

U.S. PATENT DOCUMENTS

| | | | |
|---|---|---|---|
| 3,253,165 | 5/1966 | Cornish | 326/132 |
| 3,384,760 | 5/1968 | Cooperman | 326/134 |
| 5,140,188 | 8/1992 | Burns | 327/78 |
| 5,444,751 | 8/1995 | Sage | 377/78 |
| 5,698,997 | 12/1997 | Williamson, III et al. | 326/134 |

OTHER PUBLICATIONS

Axelrod, M.S., et al., "Some New High–Speed Tunnel–Diode Logic Circuits", *IBM Journal*, 158–169, (Apr. 1992).

Chang, L.L., et al., "A Perspective of Resonant Tunneling", *NATO ASI Series, Series B: Physics vol. 277*, Plenum Press, New York, 1–15, (1991).

Chow, W.F., "Tunnel Diode Digital Circuitry", *IRE Transactions on Electronic Computer*, 295–301, (Sep. 1960).

Chow, W.F., *Principles of Tunnel Diode Circuits*, John Wiley & Sons, Inc., pp. 183–348 (1964).

Cooperman, M., "Gigahertz Tunnel–Diode Logic", *RCA Review*, 424–457, (Sep. 1967).

Davidovich, M.A., et al., "Resonant Interband Tunneling", *NATO ASI Series, Series B: Physics vol. 277*, Plenum Press, New York, 61–63, (1991).

Liu, H.C., et al., "High–Frequency Resonant–Tunneling Devices", *Semiconductors and Semimetals, 41*, 404–411, (1994).

Sollner, T.L., et al., "Resonant–Tunnelling–Diode Circuits", *Int. Semicond. Dev. Res. Symp.*, Charlottesville, VA., 307–310, (Dec. 1–3, 1993).

Wei, S.J., et al., "A Self–Latching A/D Converter Using Resonant Tunneling Diodes", *IEEE J. Solid State Circuits, 28, No. 6*, 697–700, (Jun. 1993).

*Primary Examiner*—Jon Santamauro
*Attorney, Agent, or Firm*—Schwegman, Lundberg, Woessner & Kluth, P. A.

[57] ABSTRACT

Negative-resistance resonant tunnel diodes (RTDs) perform a complete set of logic functions with a single basic configuration. Inputs feed through Schottky diodes to a transfer RTD coupled to a clocked latch having two RTDs in series. Cascaded gates are driven synchronously by multiple clock phases or by asynchronous event signals. An XOR configuration also provides logical inversion.

21 Claims, 7 Drawing Sheets

RESONANT TUNNELING DIODE STRUCTURES FOR FUNTIONALLY COMPLETE LOW-POWER LOGIC

This application is a continuation of U.S. patent application Ser. No. 08/534,955, filed Sep. 28, 1995, now U.S. Pat. No. 5,698,997.

BACKGROUND

The present invention concerns negative-resistance semiconductor devices known as resonant tunneling diodes, and more particularly concerns configurations of such devices for performing a complete set of logic functions at very high speed and low power.

For years after their introduction, tunnel diodes were proposed for many different applications. Their extremely high speed of operation tantalized workers in both analog and digital fields. Nevertheless, disadvantages in several areas limited their usefulness in practical digital circuits. Unwieldy components such as inductors and resistors consumed excessive space and power, for example. Early bipolar transistors offered higher current gain and better isolation than tunnel diodes. Perhaps most significant was the fact that the most useful tunnel diodes were made from germanium; this made it impossible to incorporate them into integrated circuits with silicon-based transistors. Although several logic configurations were proposed for tunnel diodes, each of these had additional disadvantages, beyond the problems associated with tunnel diodes in general. Bipolar and CMOS transistors continue to dominate digital electronics, as incremental improvements push them to ever higher speed and lower power. Although significant improvements provided by resonant tunneling in the 1970s have aroused increasing academic interest, two decades have passed without much practical application of these devices.

In retrospect, it seems almost ironic that some of the advances made for other semiconductor technologies could reduce the obstacles to returning to negative-resistance two-terminal tunneling devices for digital purposes. H.C. Liu et al., "High-Frequency Resonant-Tunneling Devices", in SEMICONDUCTORS AND SEMIMETALS, Vol. 41 (1994), pp. 359–419, reports a dramatic rise in papers dealing with resonant-tunneling devices (RTDs); however, the only digital circuits described are a shift register and a set/reset flip-flop.

Another problem with conventional tunnel-diode logic is providing an inversion or logic NOT function. Transistor-based logic is inherently inverting, and logical inversion is the simplest and fastest function of all to implement. Indeed, the basic elements of transistor logic are not AND and OR, but their complements, NAND and NOR. Tunnel-diode logic, on the other hand, is positive logic; achieving the inversion necessary for a complete set of logic functions is neither simple nor fast.

SUMMARY OF THE INVENTION

The present invention harnesses the inherent advantages of negative-resistance via resonant tunneling along with process improvements in other semiconductor technologies and a modification of previous resonant tunneling diode (RTD) configurations to produce an extremely capable full-function logic family. The present invention finds utility in many applications requiring high speed at low power levels, such as digital signal processing, digital radar, and cache memories.

RTD logic according to the invention offers its high speed at power levels much lower than other technologies. Although some conventional transistor designs exist which are capable of operating near the clock speed of the preferred embodiment described below, the power dissipation per gate is many times that presently achievable with the present invention. Another advantage is the potential for higher noise immunity from having two stable operating points.

In addition, circuits having numerous logic elements according to the invention can be fabricated at high packaging density, using conventional processes. Whereas typical tunnel-diode logic provides only positive functions, the present devices provide a complete set of logic functions, including inversion. The present logic-element design also lends itself to functions more difficult to perform with other technologies, such as majority logic and multi-valued logic.

The present invention includes a resonant tunneling device (RTD) structure which feeds multiple mutually isolated currents representing logic signals through isolating input devices and a common transfer device into a clocked latch having a pair of devices in series. Varying the relative areas of the devices determines which logic function is performed. The latch output can be coupled from the junction of the latch devices into one of the logic inputs of a following stage, whose latch may be clocked with a clock signal shifted in phase with respect to that applied to the first latch, so that successive logic functions implemented according to the invention are pipelined or peristaltic. Alternatively, the clock input can be event-driven to allow asynchronous logic designs.

One of the physical configurations of the invention produces an output when one and only one of two inputs is active—i.e., an "exclusive-OR" (XOR) logic function. This is achieved by constructing the components so as to switch the common transfer RTD when both of its inputs are high, but not to switch it when only one is high. This also provides a logic NOT or inversion function when one of the XOR inputs is tied to the proper signal level.

Multiple gates can be interconnected with each other in a network by providing clock signals which are separate for adjacent gates. Gates can be interconnected in alternating sets or ranks which receive clock signals generated as different phases of a common signal, to provide synchronous network operation.

Some or all of the devices in each gate may be fabricated in the form of individual cells of the same type, various numbers of which may be selectively wired or "strapped" together so as to provide different logic functions in each gate on an individual basis. An array of such gates is thus personalizable not only as to intergate connections, but also as to the specific logic functions provided by the gates.

Other aspects and advantages of the present invention, as well as variations within the scope of the invention, will become apparent to those skied in the art from the following description of the preferred embodiments.

DESCRIPTION OF A PREFERRED EMBODIMENT

Figure 1B:
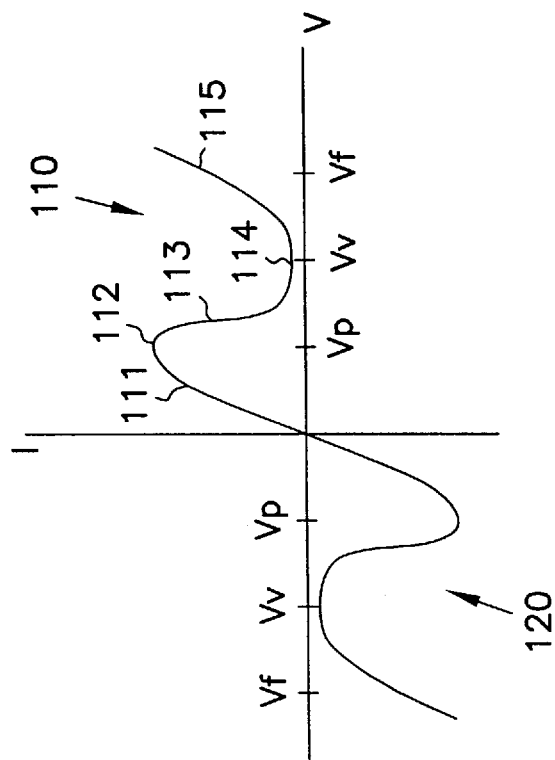
FIG. 1A–1B show a schematic of a resonant-tunneling device or diode (RTD) useful in the present invention in FIG. 1A, and a characteristic curve of this RTD in FIG. 1B.
Figure 1A:
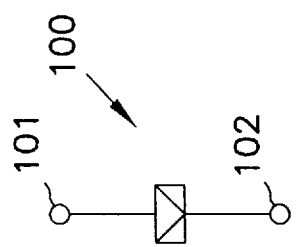

FIG. 1A shows a symbol for a resonant-tunneling device or diode (RTD) 100, having an external connection 101 to an anode or collector electrode, and a second external connection 102 to a cathode or emitter electrode. The terms "anode" and "cathode" may be interchanged, because an RTD is a symmetrical bidirectional device.

FIG. 1B is an I/V characteristic curve of an RTD. In the first quadrant 110, increasing voltage first causes tunneling current to increase along positive-resistance segment 111 to a peak 112 at a voltage $V_p$, and then to decrease in region 113. At a broad valley 114, the declining tunneling current is counterbalanced by increasing thermionic current flow at voltage $V_v$, and thereafter increases along positive-resistance region 115, past the point $V_f$ where the thermionic current exceeds the peak tunneling current. As mentioned above, the characteristic in third quadrant 120 is antisymmetrical to that of first quadrant 110, although this feature is not employed in the present embodiment.

The high differential negative resistance in region 113 provides fast switching and highly distinct switching states. The high ratio of peak current at 112 to valley current at 114 provides high output drive capability. In addition, RTDs can be fabricated to have tunneling peaks at voltages lower than those for other tunneling diodes, and very much lower than voltages used for transistor logic, so that the low power levels necessary for low heat dissipation are easily achievable, even at very high speeds. Logic constructed according to the invention has achieved 0.4 mW/gate at clock speeds of 12 GHz with presently available materials and fabrication techniques; this is about ¹⁄₂₀ to ¹⁄₄₀ as much power as GaAs heterojunction bipolar transistors or other known devices capable of operation at similar speeds. Moreover, the high current density of an RTD at tunneling peak and its low parasitic capacitance increase switching speeds over other device types useful in logic applications; a typical switching speed for the present embodiment is about 10 picoseconds. RESONANT TUNNELING IN SEMICONDUCTORS: PHYSICS AND APPLICATIONS, L. L. Chang et al., Editors (Plenum Press, 1991) contains additional background material concerning these devices.

The presently preferred embodiment employs the "interband" type of RTD, which takes advantage of tunneling from the conduction band of the anode to the valence band of the quantum well, and from there to the conduction band of the cathode. An advantage of this type for the present purposes is its low peak voltage (typically about 0.12 V), which lowers the overall power of the devices, and hence the heat dissipation of the circuits. Other RTD structures are also feasible, however, and it is even possible that high negative-resistance Gunn or IMPATT (avalanche) diodes might prove useful.

FIG. 2 is an analysis of an RTD latch employed in the invention. FIG. 2A symbolically shows a latch 200 having two series-connected interband RTDs according to FIG. 1. A clock waveform 201 having a repeating train of zero-voltage levels 202 and positive levels 203 is applied to an anode terminal 204 of load RTD 205. Signal input terminal 206 connects to the cathode of RTD 205, to signal output terminal 207, and to the anode of latch RTD 208. The cathode of RTD 208 connects to a ground potential which is common to clock 201, input 206, and output 207. The signal input at 206 is isolated from the output 207 in a manner to be described in connection with FIG. 3. The absolute sizes of RTDs 205 and 208 may vary according to several factors. The available latch output current is enhanced by the inherently high peak/valley current ratio of RIDs, and operating speed is enhanced by their high negative differential resistance. In the presently preferred embodiment, the areas of RTDs 205 and 208 are fixed for all types of gate in the same circuit. Because node 209 is always held at ground potential (0 volts), negative applied voltages never occur across the latching pair of RTDs 205 and 208. Therefore the hatched portions of FIGS. 2B–2D are included for illustrative purposes only.

Figure 2A:
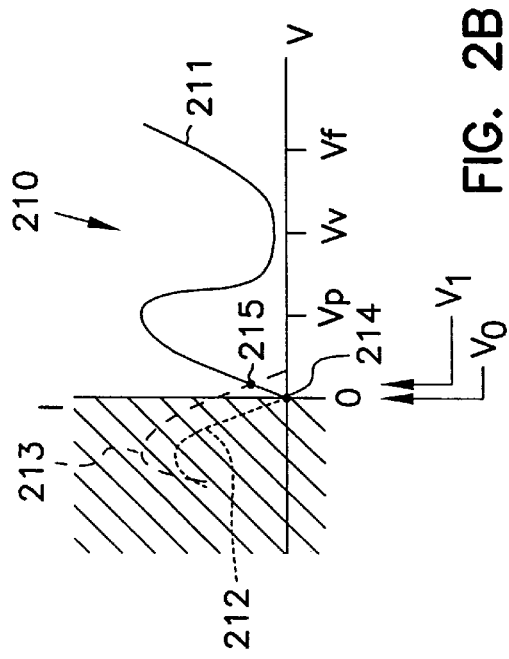
FIG. 2A–2D show an RTD latch employed in the invention in FIG. 2A, and load-line diagrams of this latch at three times in a clock cycle in FIGS. 2B, 2C, and 2D.
Figure 2B:
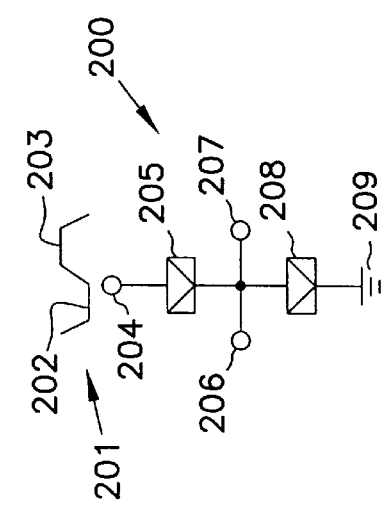

FIG. 2B shows DC load lines 210 of the latch elements during the "zero" level 202 of clock wave 201, FIG. 2A, that is, when $V_{clock}$ is low. Curve 211 is the I/V characteristic of load RTD 205. The tunneling peak voltage is $V_p$, and the tunneling valley voltage is $V_v$; the forward voltage $V_f$ may be taken as that voltage along the normal-diode portion of the curve where the current equals the peak tunneling current for the tunneling mode at $V_p$. Curve 212 shows the I/V characteristic of storage RTD 208 for a logic "zero" voltage at input terminal 206. Curve 213 is a similar curve for a logic "one" voltage at input 206. The intersection of curves 211 and 212 at 214 represent the operating point $V_0$ for a logic "zero" input. Operating point $V_1$ for a "one" input is slightly higher, but still much less than $V_p$.

Figure 2C:
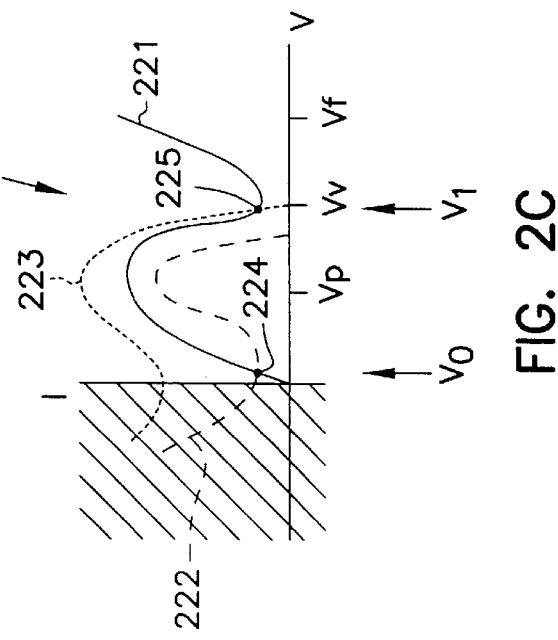
Figure 2D:
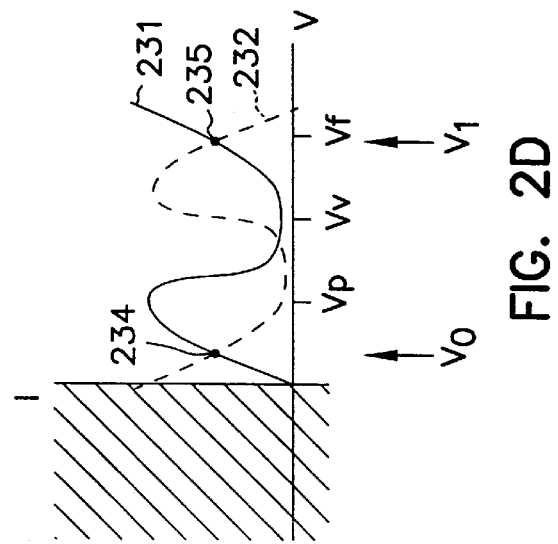

FIG. 2C occurs during the transition of $V_{clock}$ from low to high. When the input is a logic "zero", the intersection 224 of load RTD curve 221 with storage RTD curve 222 remains at a low voltage, less than VP of the load device. On the other hand, a logic "one" causes operating point 225 to move to the right along curve 223 to its intersection with curve 221, near $V_v$ of the load device. FIG. 2D represents the latched state during the interval 203 of FIG. 2A while $V_{clock}$ is high. As will be described, the input at terminal 206 is isolated at this time, so there is only a single curve 232 for either previous state of the inputs. However, this curve now intersects curve 231 of the load-device curve at two points, rather than at a single point. Because the output voltage at terminal 207 can have only a single value at any time, its value is trapped near its previous value in FIG. 2C. If a low logic input had placed $V_0$ at point 224 in FIG. 2C, it can change only a small amount to point 234 in FIG. 2D. If a high input had placed $V_1$ at point 225, then it moves the small distance to intersection 235. As long as $V_{clock}$ remains high, the output voltage at 207 remains latched low or high.

Although waveform 201 is referred to as a clock signal throughout this description, it is not limited to a train of fixed-frequency pulses. Its only requirements are two levels, one of which allows a signal to set the operating point of the latch, and the other of which holds the latch at its previous level after the input signal has gone away. For example, waveform 201 could come from a trigger or other event input. Also, load RTD 205 could theoretically be implemented as another type of device, such as a Schottky diode or high-performance transistor. However, an RTD load device has several advantages in the present invention. For instance, it furthers the goal of reducing power dissipation in a high-speed logic circuit. A second significant advantage concerns compensation for process variations. The parameters of RTDs are difficult to control accurately, but they are very consistent locally on the same wafer. Therefore, parameter changes in storage RTD 208 are nullified to a great extent by similar changes in load RTD 205.

Figure 3B:
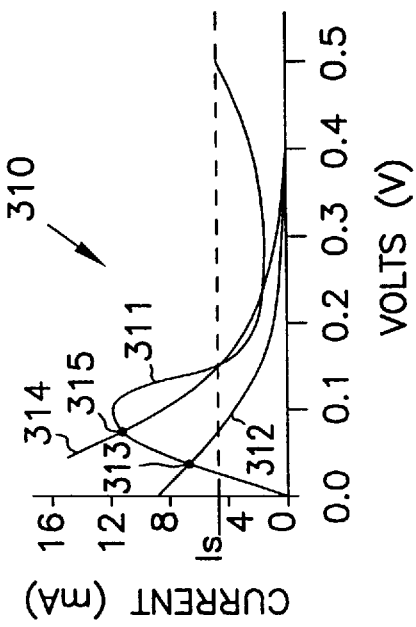
FIG. 3A–3D show the implementation of a single logic stage according to the invention, in FIG. 3A, and load-line diagrams of an transfer RTD for three logic functions in FIGS. 3B, 3C, and 3D.
Figure 3D:
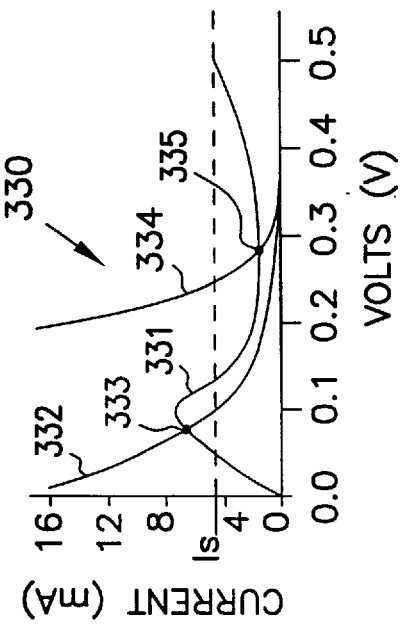
Figure 3A:
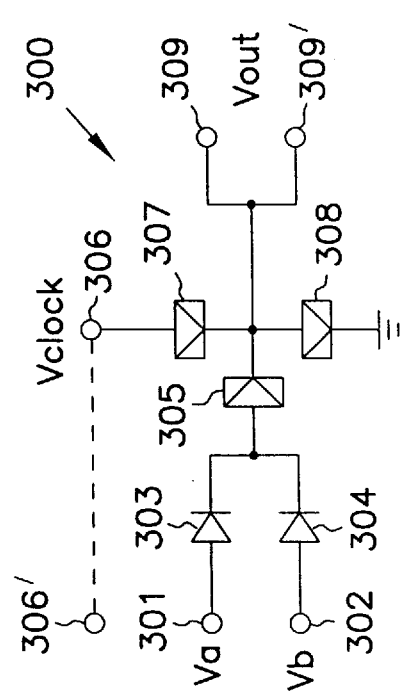

FIG. 3A shows a configuration of RTDs and other devices in one stage of a cascade for performing logic functions according to the invention.

Multiple input terminals 301 and 302 accept voltages $V_a$ and $V_b$, each representing discrete "zero" or "one" logic levels. Schottky diodes 303 a and 304 isolate the inputs from each other, coupling them both to the anode of an input interband RTD 305. The anode electrodes of these diodes connect to the separate input terminals. The fabrication of Schottky diodes is compatible with processes for constructing RTD devices. From a purely electrical standpoint, other isolation devices, such as integrated transistors, could be used instead.

The anode of transfer RTD 305 couples the input Schottky diodes 303 and 304 together to form a common input node. The basic purpose of device 305 is to transfer a combination of the currents from the isolation diodes 303 and 304 at the common input node to the latch described below. Where this combination is simply a sum of the input currents, some other device, such as a transistor, could conceivably be substituted for Schottky diodes 303 and 304 and/or RTD 305. For some logic functions, however, transfer device 305 must transfer a different combination of input currents to the latch. For example, the XOR circuit described below requires that the current to the latch be low when no input signals are high, increase to a higher current when one input becomes high, then decrease to a lower current when two inputs become high. Thus the XOR function requires that transfer device 305 be an RTD.

Clock terminal 306 and RTDs 307 and 308 form a latch which operates in the same manner as latch 200, FIG. 2. The cathode of RTD 305 couples the input circuit to the input of the latch. The latch output is shown divided into two terminals 309 and 309', which symbolizes a maximum output loading of two standard loads. Either terminal or both may couple to the inputs of succeeding stages, as described in connection with FIG. 5.

The same structural configuration or floor plan of FIG. 3A can perform any of a number of different logic functions of its multiple logic inputs 301 and 302, merely by varying the relative areas $A_{305}$, $A_{307}$, and $A_{308}$ of the RTD devices 305, 307, and 308 in stage 300. The relevant voltage is the level of $V_{out}$ resulting from various combinations of voltage inputs $V_a$ and $V_b$. Table I below contains values of $V_{out}$ for three sets, 310, 320, and 330, of device sizes (in square microns), for each of the four possible combinations of logic levels of $V_a$ and $V_b$. Logic low and high values for $V_a$, $V_b$, and $V_{out}$ are denoted as "0" and "1", respectively.

TABLE I

| $A_{303}$ | $A_{304}$ | $A_{305}$ | $A_{307}$ | $A_{308}$ | $V_a = 0$ $V_b = 0$ | $V_a = 0$ $V_b = 1$ | $V_a = 1$ $V_b = 0$ | $V_a = 1$ $V_b = 1$ |
|---|---|---|---|---|---|---|---|---|
| 40 | 40 | 25 | 30 | 36 | 0 | 1 | 1 | I |
| 30 | 30 | 25 | 30 | 36 | 0 | 0 | 0 | 1 |
| 48 | 48 | 20 | 30 | 36 | 0 | 1 | 1 | 0 |

The first set of devices sizes above produces a logic "1" (high) output voltage when at least one of the logic inputs is at logic "1", which corresponds to a logic OR function. The second set produces a "1" output when both inputs are "1", for an AND function. The third set of device sizes outputs a "1" only when one and only one of the two inputs is logic "1"; this is an XOR function.

That is, the invention has the ability to perform any of multiple different logic functions with the same circuit configuration or floorplan merely by varying the sizes or relative areas of devices 303–305 during fabrication, in order to control the amount of current flowing into storage RTD 308 for various combinations of voltages at inputs 301 and 302. Preferably, the areas of the load and storage RTDs 307 and 308 are the same for all logic functions; this simplifies fabrication by reducing the number of devices which must be changed to personalize a given stage to perform a desired logic function.

Figure 3C:
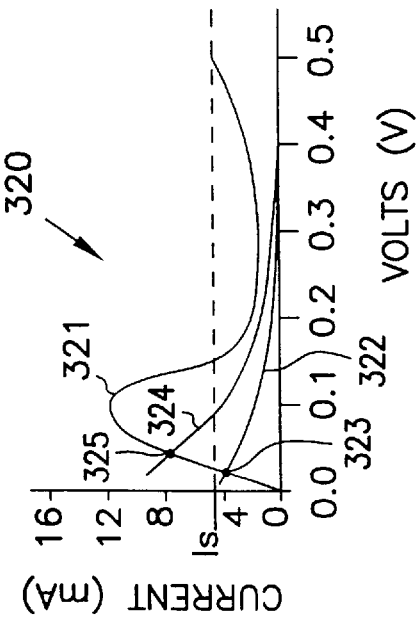

FIGS. 3B, 3C, and 3D portray the operating points of transfer RTD 305 for these three sets of device areas for the various combinations of input logic levels. FIG. 3B shows current/voltage curves 310 for device sizes which produce an OR gate. Curve 311 represents the characteristic behavior of transfer RTD 305. The horizontal dotted line $I_s$ represents the minimum current required to switch the latch in FIG. 3A to a high state when the clock rises. Load line 312, representing the behavior of one and only one of RTDs 303 and 304, occurs when a single input 301 or 302 is at a high (logic "1") voltage. Operating point 313, where curves 311 and 312 intersect, produces a current higher than $I_s$. When both inputs 301 and 302 are high, curve 314 (representing the combined behavior of both RTDs 303 and 304) intersects curve 311 at operating point 315, which produces a current much higher than $I_s$. Therefore, the set of device areas shown in the first line of the above table causes the output voltage at 309 to be high whenever one or both of the inputs is high. This defines an OR function.

FIG. 3C shows curves 320 for an AND gate, using the device sizes in the second row of the above table. Curve 321 represents the characteristic behavior of transfer RTD 305. In this case, when only one input is high, curve 322 (showing the behavior of one and only one of the input diodes 303 and 304) intersects curve 321 at an operating point 323 whose current is less than $I_s$, and thus insufficient to switch the latch high. When both inputs are high, however, curve 324 (showing the combined behavior of diodes 303 and 304) causes the operating point to move to point 325, above $I_s$, so that the output 309 is latched at a high voltage. This provides an AND function.

FIG. 3D shows curves 330 for an XOR gate, which produces a high output at terminal 309 when one or the other input is high, but produces a low output when both are high. Curve 331 represents the characteristic behavior of transfer RTD 305. Curve 332 (showing the behavior of one and only one of the input diodes 303 and 304) occurs when one input is high. For device sizes in the third row of Table I, curve 332 intersects curve 331 at operating point 333. This point produces more current than the $I_s$ required to switch the latch. Curve 334 (showing the combined behavior of input diodes 303 and 304) intersects 331 past the peak tunneling-current point of RTD 305, producing a current below $I_s$, low enough that the latch does not switch to a high voltage, so that the output at terminal 309 remains low. The XOR function is the only one of the three which requires the negative-resistance region of transfer device 305; thus, if only AND and OR gates are required, this device could be replaced by some other type of device whose curve has only a positive slope.

Thus far, input 306 has served only as a fixed wavetrain for latching signal inputs 301, 302 into the latch at a fixed sequence of set times. Another aspect of the invention, however, is that this input may instead be coupled to another logic input signal, as indicated by the dashed line to a third input terminal 306'. That is, input 306' may be coupled to a logic input signal in the same manner as inputs 301 and 302, to expand the fan-in capabilities of gate 300, and to provide additional logic functions. For example, gate 300 could be configured as an OR gate which is ANDed with an ordinary logic signal at input 306'. Input 306' could serve as an asynchronous trigger signal from an external event to capture the logic signals at inputs 301 and 302.

Constraints upon the RTD devices of FIG. 3 may be most easily specified in terms of the current required to switch the output 309 of the latch in FIG. 3A to its high-voltage state. Let:

- $I_s$=minimum current needed to switch the latch;
- $I_o$=a conventional overdrive current for increasing switching speed;
- $I_n$=maximum absolute value of current due to noise.
- $I_L$=current through transfer RTD 305 when one input voltage has a value corresponding to logic "low";
- $I_H$=current through transfer RTD 305 when one input voltage has a value corresponding to logic "high ". For each RTD r, where r may represent any of the devices 305, 307, or 308, let:
- $I_{pr}$=peak tunneling current of RTD r;
- $I_{vr}$=valley current of RTD r. An additional subscript may indicate a desired logic function {OR, AND, XOR}, and a superscript may indicate that a quantity is to be taken at its maximum or minimum value {+, −} within a specified tolerance.

This analysis assumes a fanin of two inputs 301 and 302, and a fanout of two loads driven from outputs 309 and 309'. First, $I_s$ must be capable of switching the latch to a high state under the worst-case conditions:

$$I_s \leq (I^+_{p308} + I^-_{p307}) + I_n + I_o - C\frac{dV}{dt}$$

where C is the parasitic capacitance in parallel with the latch diode and V is the output voltage. Second, enough latch output current must always be available for a fanout of two. The most heavily loaded condition occurs when a gate drives two OR gate inputs. This requirement is satisfied when:

$$I_{p307}^- - I_{v308}^+ - I_n \geq 2(I_H^+)_{OR}$$

Each type of gate has its own defining equations, which are algebraic statements of the load-line diagrams in FIGS. 3B–3D. Holding both inputs 301 and 302 at logic "zero" always forces the current below the point which causes a switching event; that is, $$2I_L^+ + I_n < I_s$$

An AND gate requires that the output remain low when one input is high and the other is low, that is:

$$(I_L^+)_{AND} + (I_H^+)_{AND} + I_n < I_s$$

When both inputs are high, RTD 305 must pass a current greater than $I_y$, yet not so much current that RTD 305 switches to its low-current state:

$$2I_H^- - I_n \geq I_s$$

$$2I_H^+ + I_n \leq (I_{p305})_{AND}$$

An OR gate must satisfy the following condition when a single input 301 or 302 is held at a logic "one" (high) voltage:

$$(I_L^-)_{OR} + (I_H^-)_{OR} - I_n \geq I_s$$

Furthermore, the transfer RTD must not switch to its high-voltage state if both inputs are high. In other words, an operating point must still exist somewhere in the high-current, low-voltage region of RTD 305; that is, $$2I_H^+ + I_n \leq I_{p305}$$

The XOR gate configuration is the one which allows the present invention to form a complete logic family with positive-logic AND and OR gates, because it is capable of forming an inverter. The operation of this configuration is somewhat more complex than that of the others. The AND and OR gates described above use transfer RTD 305 as a resistor, and always operate in the first positive-resistance region of its current/voltage characteristic curve, as shown in FIGS. 3B and 3C. Achieving the negation function inherent in the XOR, however, requires that transfer RTD 305 move to an operating point, point 335 in FIG. 3D, near the valley of its IN curve 331 when both inputs are high. That is, increasing the total input current always produces a higher current to the RTD latch in all other gates, but the XOR requires that increasing input current produce at first a higher and then a lower current at the latch. Expressed mathematically, the conditions for a single output in the high state are:

$$(I_L^-)_{XOR} + (I_H^-)_{XOR} - I_n \geq I_s$$

$$(I_L^+)_{XOR} + (I_H^+)_{XOR} + I_n \leq (I_{p305})_{XOR}$$

When both inputs are in the high state, these conditions become $$2(I_H^-)_{XOR} - I_n \geq (I_{p305})_{XOR} + I_o$$

$$(i\ I_{v305})_{XOR} + I_n \leq I_s$$

Figure 4:
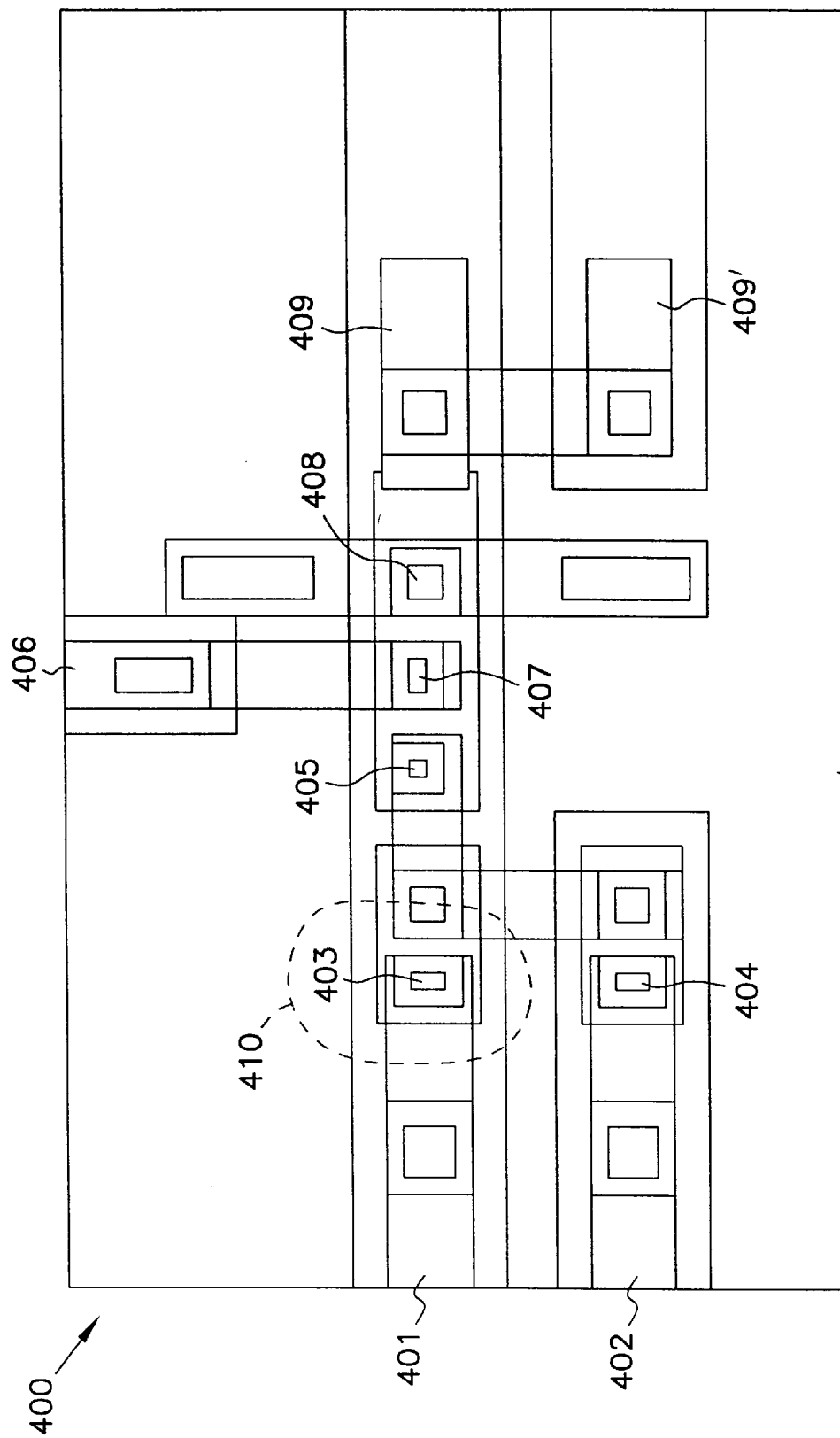
FIG. 4 shows a physical layout of the logic gate represented in FIG. 3.

FIG. 4 shows a layout or floor plan 400 for a representative generic logic gate of FIG. 3A. This particular structure was fabricated for testing purposes, so the contact leads and pads are much larger than they would be in an array of logic gates on a chip. Contacts 401, 402 correspond to logic inputs 301, 302 of FIG. 3; Schottky diodes 303, 304 are located at 403, 404, and transfer RTD 305 at 405. Clock contact 406 drives load RTD 307 at location 407; storage RTD 308 at 408 is coupled to ground plane 410. Output contacts 409 and 409' correspond to terminals 309, 309' in FIG. 3A.

The components in this logic gate 400 may be built by molecular-beam epitaxy upon a GaAs wafer. This fabrication approach allows the inclusion of conventional high-speed transistors and other device types along with the RTD gates in the same integrated circuit. The RTD devices have anodes and cathodes of InAs. These electrodes are separated by a double barrier of a wide band-gap semiconductor such as AlSb, separated in turn by a quantum well of a narrower band-gap semiconductor such as GaSb; the barrier and well layers are as thin as possible, preferably only a few atomic layers thick. This configuration produces an "interband" type of resonant operation, tunneling from the conduction band of the anode to the valence band of the GaSb quantum well, and thence to the conduction band of the cathode. This structure achieves a high tunneling-current density (about 0.32 mA/$\mu^2$) and low parasitic capacitance, for high-speed switching. A low peak voltage is also characteristic of interband tunneling, and this dramatically lowers the power dissipation of the circuits. In the present embodiment, $V_p$ occurs at 0.12 V, which allows operation at a power level of less than 0.5 mW/gate at a clock speed of 12 GHz. Another advantage is the high (about 8:1) peak/valley current ratio of the RTDs, which increases the output current available to drive succeeding logic gates; a fanout of two is easily achievable. Other RTD parameters of this embodiment include a valley voltage $V_v$=0.3 V, and $V_j$=0.7 V for the point where normal (thermionic) current becomes equal to the peak tunneling current.

Another aspect of the invention concerns the input isolating devices 303 and 304, FIG. 3, shown at locations 404 and 404 in FIG. 4. Although conventional components such as transistors can be employed for devices 403 and 404, diodes consume less power and are easier to fabricate. In particular, Schottky diodes constructed from a superlattice of InAs/AlSb lower the band-gap of the InAs enough that the diodes turn on at about 0.1 V, lower than the 0.12 V tunneling peak of the RTDs.

Figure 4A:
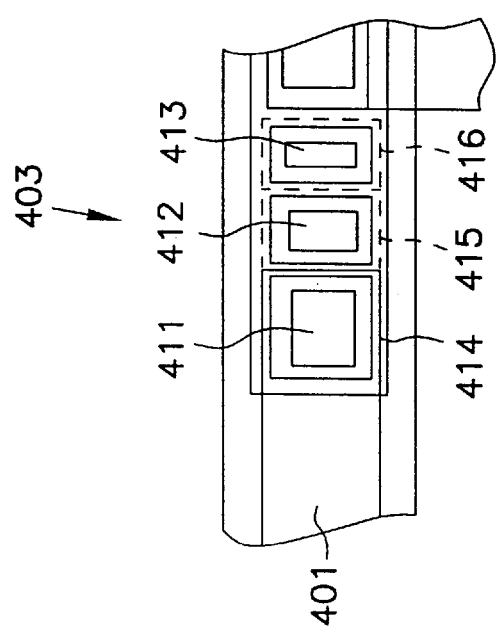
FIG. 4A details a variation in the gate layout of FIG. 4.

FIG. 4A shows a variation in the floorplan 400, in the portion indicated by light line 410 in FIG. 4. As noted above in connection with FIG. 3 A and TABLE I, fabricating the devices 303–305 with different sizes allows the same basic circuit to provide any of several different logic functions. FIG. 4A replaces the single Schottky diode 403 of FIG. 4 with a cluster of three separate Schottky-diode cells 411–413 having their cathodes permanently coupled together as in FIG. 4. However, the anodes of diodes 411–113 can be selectively coupled together during fabrication merely by masking different parts of input line 401. That is, fabricating line 401 as shown by solid line 414 couples only the first diode cell 411 into the circuit as diode 403, leaving the remaining diode cells 412 and 413 nonfunctional. If line 401 is extended during fabrication as indicated by dashed line 415, diodes 411 and 412 are connected in parallel, effectively forming a single larger diode as input Schottky diode 403. If line 401 is further extended as indicated by dashed line 416, all three diodes 411–413 are paralleled, effectively forming a still larger Schottky diode 403. Making the areas of diode cells 411–413 respectively $30\mu^2$, $10\mu^2$, and $8\mu^2$ allows the total area of diode 403 to be made $30\mu^2$, $40\mu^2$, or $48\mu^2$, merely by varying the length of conductor 401 in a conventional metallization step during the fabrication of circuit 400. Dividing Schottky diode 404 into another cluster of smaller diode cells (not shown), allows its effective area to be varied in exactly the same manner. Dividing RTD 405 similarly into a cluster of two individual RTD cells having areas of $20\mu^2$ and $5\mu^2$ allows its effective area to be made either $20\mu^2$ or $25\mu^2$ during fabrication.

Functional personalization of a gate with cells can be achieved by building various devices or combinations of devices within a gate as multiple cells to be strapped together. As described above, we prefer to fabricate the latch devices 307 and 308 as single devices, and to employ the multiple-cell technique for input devices 303 and 304 and for transfer device 305. The present cells differ from one another as to area, although it is possible to achieve the same effect by varying other parameters of the cells instead. All cells of the same device have a common operational type; that is, all cells of Schottky diode 303 are themselves Schottky diodes, all cells of RTD 305 are RTDs, etc.

An array of identical gates according to this aspect of the invention arranged in a conventional manner on a wafer allows large numbers of identical integrated-circuit chips to be fabricated and stockpiled with only a final metal interconnection layer left uncompleted. Conventional practice personalizes the interconnections of arrays of single-function gates formed earlier in a wafer. The present invention allows an additional personalization: the logic function performed by each gate can be individually personalized after all the devices in the gate have been already fabricated. Moreover, the personalization of gate function need not require any fabrication steps in addition to those already employed for personalizing the intergate connections; altering gate functions can employ the same types and levels of metallization for strapping together the required number of individual device cells as those employed for connections among the gates in the array TABLE II below uses the example device sizes given above to demonstrate how devices can be combined to achieve all the logic functions of TABLE I. For example, a gate may be personalized to the AND function of the first row of TABLE II by strapping a $30\mu^2$ Schottky diode cell to a $10\mu^2$ Schottky-iode cell to provide an input Schottky diode 303, FIG. 3, having a total area $A_{303}$ of $40\mu^2$, as required in the first row of TABLE I. Input Schottky diode 304 is constructed in the same way to achieve the necessary $40\mu^2$ area $A_{304}$ of input Schottky diode 304. The $25^2\mu$ total area $A_{305}$ of transfer RTD 305 is formed simply by strapping together a $20\mu^2$ RTD cell and a $5\mu^2$ RTD cell. Again, making the areas of the latch RTDs 307 and 308 constant for all of the logic functions reduces the number of devices required.

TABLE II

| $A_{303}$ | $A_{304}$ | $A_{305}$ | $A_{307}$ | $A_{308}$ | $V_a = 0$ $V_b = 0$ | $V_a = 0$ $V_b = 1$ | $V_a = 1$ $V_b = 0$ | $V_a = 1$ $V_b = 1$ |
|---|---|---|---|---|---|---|---|---|
| 30 + 10 | 30 + 10 | 20 + 5 | 30 | 36 | 0 | 1 | 1 | 1 |
| 30 | 30 | 20 + 5 | 30 | 36 | 0 | 0 | 0 | 1 |
| 30 + 10 + 8 | 30 + 10 + 8 | 20 | 30 | 36 | 0 | 1 | 1 | 0 |

Figure 5:
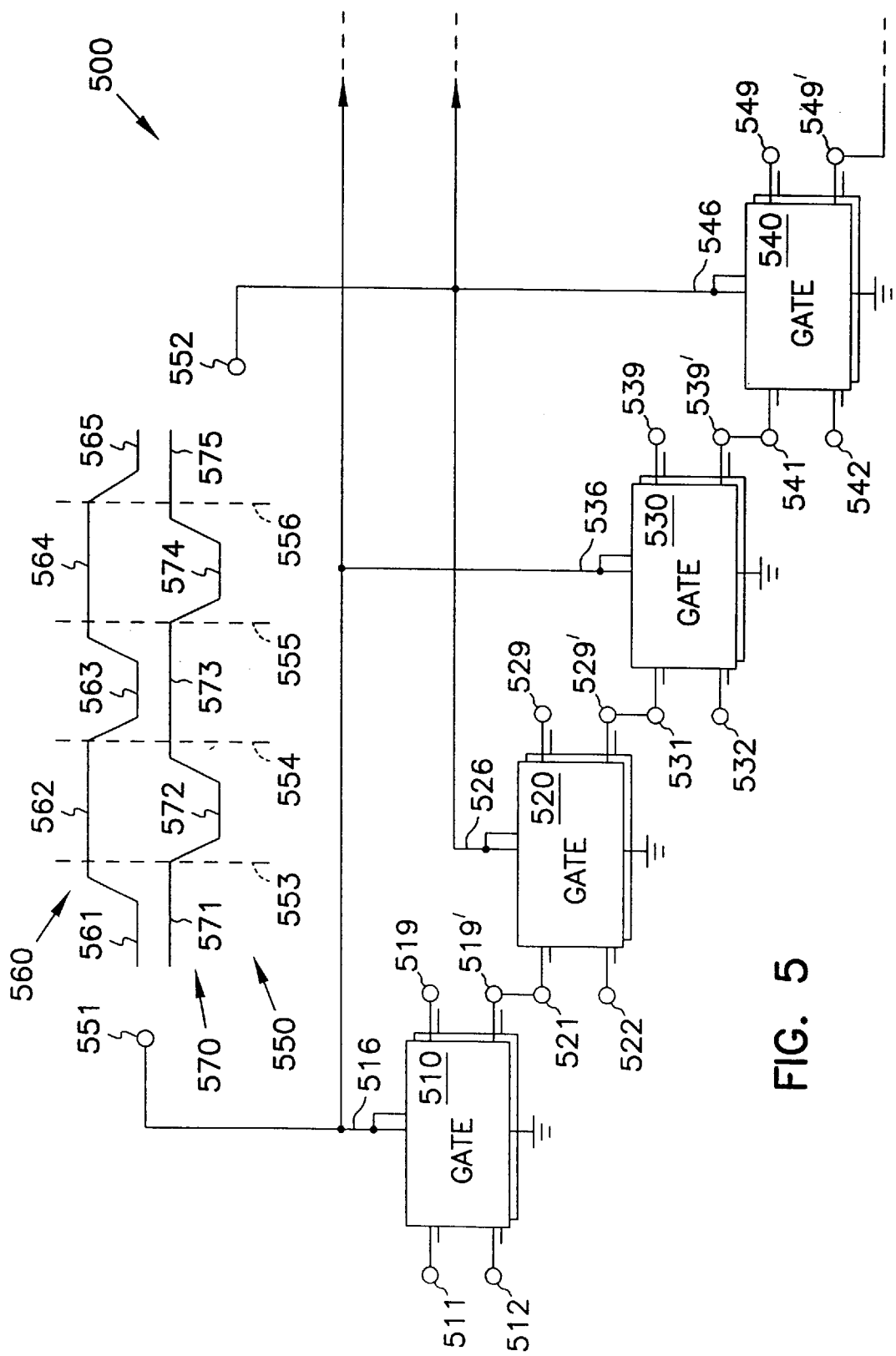
FIG. 5 shows a multi-gate cascade of logic functions according to FIG. 3, including clock-signal timing.

FIG. 5 illustrates an array 500 of logic gates according to the invention, particularly the timing of the clock signals required to pipeline logic functions. Gates 510–540 represent individual logic functions 300, FIG. 3A. Any of the gates may perform any of the functions shown in FIGS. 3B–3D. Any of the functions requires time for one potential switching event to occur in the latch formed by RTDs 307 and 308 in FIG. 3A; this event leaves the latch at operating point 234 or 235 in FIG. 2D. An XOR gate must allow time for two sequential switching events: the first event is the switching of transfer RTD 305 in the case that both inputs are high This event is shown at operating point 335, FIG. 3D. The second switching event is the same latching operation as that of the other logic functions Therefore, the XOR gate configuration is the slowest, and places an upper limit on the Speed of the entire array 500.

A conventional high-speed generator 550 produces overlapping two-phase clock waveforms 560 and 570. These waveforms have three functions: to acquire and hold the input logic signals of each gate when they have become stable, to isolate successive gates from each other, and to reset the gate latches between successive logic operations. Multi-phase clocking also creates a pipelined architecture at the gate level.

Gate 510 may perform any logic function upon its inputs 511 and 512 to produce an output signal at terminals 519 and 519'. Succeeding gate 520 picks up this output signal and another input signal at its inputs 521 and 522. It in turn produces an output signal at 529 and 529' representing the same or another logic function. Gates 530 and 540 are similarly connected via inputs 531, 532 and 541, 542 and outputs 539, 539' and 549, 549'. Alternating gates 510, 530, etc., have their clock inputs 516, 536, etc., connected together to a first phase output terminal 551 of high-speed clock generator 550. Alternating gates 520, 540, etc., have clock inputs 526, 546, etc., coupled to a second phase output 552 of clock generator 550. The other input 522 of gate 520 is connected to a logic gate having its clock coupled to generator output 551, as must input 542 of gate 540. Likewise, the signals on both inputs 511, 512 of gate 510, as well the signal on the as the other input 532 of gate 530, are generated by gates which obtain their clocks from output 552. That is, all the gates in a logic array according to the invention are arranged in multiple interleaved ranks, each receiving a different clock signal. Signals input to array 500 at 511, 512, etc. proceed peristaltically and synchronously through the array to outputs such as 549, 549'.

As explained in connection with FIGS. 2A and 3A, the latch 200 of a single logic gate 300 requires that its input 206 be stable during a clock-low phase 202. The signal on input 206 then becomes latched into the gate during the transition to high-clock phase 203. Using gate 520, FIG. 5, as an example, input signal 521 is stable when the latch of the preceding gate 510 has stabilized. This occurs when first clock phase 560 transits from a low value 561 to a high value 562. Thus, when second-phase clock signal 570 begins to fall from a high value 571 to a low value 572, output signal 519' has attained its correct voltage from inputs 511, 512. Just before clock phase 560 falls to trough 563 at time 554, the other clock phase 570 has risen to high value 573, thus latching the correct logic function of input signals 521, 522 while they are still receiving valid input from first-rank gates such as 510. During first-phase trough 563, the latch of gate 530 reads the input signals on its inputs 531, 532 and presents the proper combination of them to its latch during its receptive period 563. When this latch sets at the transition of clock phase 560 to high level 564, stage 520 is still latched at 573. When the latch of stage 520 becomes receptive to a new set of inputs at time 555, the high first-phase level 564 has already latched gate 530 and its outputs 539, 539'. The cycle repeats as events 564, 565, 574, and 575 pass the original inputs 511, 512 to outputs 549, 549' of gate 540 at time 556.

For two sets of alternating ranks, the optimum waveforms 560, 570 each have 75% duty cycle and are 180° out of phase with respect to each other; this allows maximum setup time for the latches of all gates. Two sets of ranks (eg., ranks 510, 530, etc. in the first set, and ranks 520, 540, etc. in the second) yields the greatest flexibility of interconnection and the simplest clock generator. Three or more sets of ranks may be employed if desired. Additional sets would require modifying the clock signals accordingly.

Array 500 may be laid out on a wafer in a conventional manner, using the floorplan of FIG. 4 and 4A for each gate. One or more conventional metallization layers suffice for intergate wiring such as that shown in FIG. 5. For the modified floorplan of FIG. 4A, one or more of these metallization layers may additionally serve to personalize the functions of the gates 510–540, as previously described.

Figure 6:
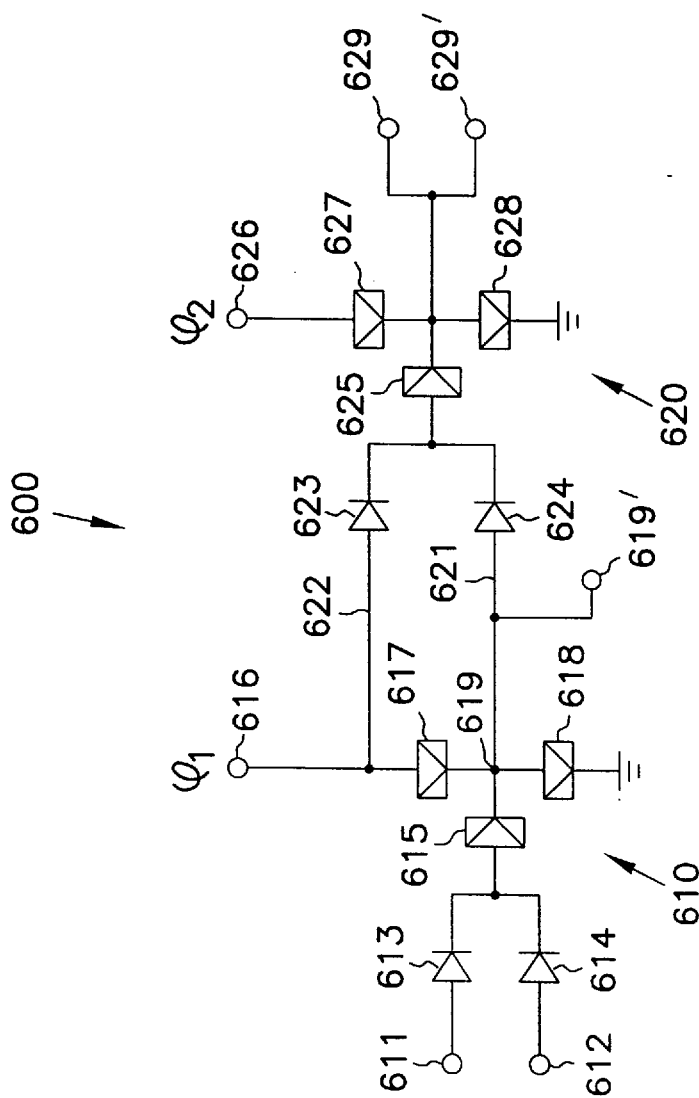
FIG. 6 shows an implementation of inverting logic based upon the cascade of FIG. 5.

FIG. 6 describes an example of inverting logic according to the invention. Configuration 600 includes a stage 610 which performs any of a number of logic functions, and a stage 620 which inverts the output of stage 610. Schottky diodes 613, 614, transfer RTD 615, and latch RTDs 617, 618 receive multiple inputs from terminals 611, 612 and a first-phase clock signal at terminal 616. Intermediate output 619 couples to one input 621 of gate 620. The other input 622 of gate 520 connects to first-phase clock terminal 616 through Schottky diode 623. Schottky diodes 623 and 624, as well as RTDs 625, 627 and 628, are sized to produce an XOR function of the two voltages at 621 and 622 when gate 620 is driven by second-phase clock 626. Clock waveforms 616 and 626 may be identical to waveforms 560 and 570 respectively. In effect, then, gate 620 mixes the output from stage 610 with a logic "one" signal taken directly from clock phase 616 to produce a NOT (or INVERT) logic function of the previous gate's output. The connection of input 622 to clock input 616 through Schottky diode 623 significantly reduces the power dissipation of gate 620 over tying input 622 to a constant "one" voltage, because a high voltage only occurs at input 622 during the time it is required to set the latch of gate 620. This inversion scheme is possible only because the design deliberately chooses clock and signal voltages sufficiently close to each other in magnitude.

Other modifications and advantages of the preferred embodiments within the scope of the claimed invention will occur to those skilled in the art. For example, the invention lends itself easily to implementing "voting logic," such as 1of-N (same as OR), 2-of-N, 3-of-N, . . . , N-of-N (same as AND) functions, and to the emerging field of multi-valued logic. Combinations with other integrated-circuit logic families on the same chip are easily possible. Although single arrays of gates according to the invention are synchronously clocked, multiple nets of clocked logic may be interconnected asynchronously with respect to each other, and the "clock" inputs of some or all stages may serve as additional logic inputs or triggers.

Having described a preferred embodiment thereof, we claim as our invention:

1. A semiconductor structure for performing any predetermined logic function of a complete logic family at high speed and low power, comprising:

a plurality of inputs each having a separate terminal for an input signal and an isolating device coupled from said separate input terminal to the isolating device of others of said inputs to form a common input node;

a transfer resonant tunnel diode having an anode coupled to said common input node and having a cathode coupled to an output node;

a clock terminal for receiving a clock waveform;

a latch having load and storage resonant tunnel diodes, said load resonant tunnel diode having an anode coupled to said clock terminal and a cathode coupled to an output node, said storage resonant tunnel diode having an anode coupled to said output node and a cathode coupled to a ground potential;

an output terminal coupled to said output node for producing at least one output signal; and wherein the current/voltage relationships of the isolating devices and the resonant tunnel diodes are selected to determine the logical function implemented by the semiconductor.

2. A structure according to claim 1, wherein each of said inputs comprises a Schottky diode having a first electrode coupled to said separate terminal and a second electrode coupled to said common input node.

3. A structure according to claim 1, wherein said input and output signals each have two levels representing logic low and high respectively.

4. A structure according to claim 3, wherein said latch produces said logic high at said output terminal when one or more of said input signals have a logic high level, whereby said predetermined logic function is an OR function.

5. A structure according to claim 3, wherein said latch produces said logic high at said output terminal only when all input signals have a logic high level, whereby said predetermined logic function is an AND function.

6. A structure according to claim 3, wherein said latch produces said logic high at said output terminal when one and only one of said input signals has a logic high level, whereby said predetermined logic function is an XOR function.

7. A structure according to claim 6, wherein said transfer resonant tunnel diode operates at a low current less than its peak tunneling current range when none of its input signals have said high level, at a higher current near its tunneling peak when one and only one input signal has said high level, and at a lower current near its valley current when more than one of its input signals have said high level.

8. A structure according to claim 1, wherein said clock waveform has a low level for receiving said input signals, and further has a high level for latching said output node at a logic level determined by said input signals, even in the absence of said signals.

9. A structure according to claim 8, further including a clock generator for producing said clock waveform as a train of pulses alternating between said low clock level and said high clock level.

10. A structure according to claim 8, wherein said clock waveform is an event signal occurring at variable times with respect to said input signals.

11. A common-floorplan circuit personalizable to perform any selected one of a complete set of logic functions, said set including both inverting and noninverting functions, comprising:

a first input isolating device having a first electrode for receiving a first input signal and a second electrode coupled to a common input node;

a second input isolating device having a first electrode for receiving a second input signal and a second electrode coupled to said common input node;

a latch having a load device and a two-terminal negative-resistance storage device, said load and storage devices being coupled together at a common output node;

a transfer device for transferring to said latch a combination of first and second input currents from the first and second input isolating devices, respectively;

a connection for coupling a clock signal to said latch, said clock signal having a first level for holding said common output node at a level determined by said combination during a second level of said clock signal previous in time to the first level of said clock signal; and wherein the current/voltage relationships of the isolating devices, the transfer device, the load device and the negative-resistance storage device are selected to determine the logical function implemented by the semiconductor structure.

12. A circuit according to claim 11, wherein the areas of said load and storage devices is substantially the same for substantially all of said multiple functions.

13. A circuit according to claim 11, wherein the relative areas of at least some devices produces enough current into said latch so as to produce a high level at said output node when one or more of said input signals has a high level.

14. A circuit according to claim 11, wherein the relative areas of at least some devices produces enough current into said latch so as to produce a high level at said output node only when all of said input signals have a high level.

15. A circuit according to claim 11, wherein the relative areas of at least some devices produces enough current into said latch so as to produce a high level at said output node when one and only one of said input signals has a high level.

16. A circuit according to claim 11, wherein said storage device is a resonant tunnel diode.

17. A circuit according to claim 16, wherein said storage device is an interband resonant tunnel diode.

18. A circuit according to claim 11, wherein said transfer device is a two-terminal negative resistance device.

19. A circuit according to claim 18, wherein said transfer device is a resonant tunnel diode.

20. A circuit according to claim 11, wherein said load device is a resonant tunnel diode.

21. A circuit according to claim 20, wherein said storage device is a resonant tunnel diode having characteristics similar to those of said load device.

* * * * *

UNITED STATES PATENT AND TRADEMARK OFFICE
CERTIFICATE OF CORRECTION

PATENT NO. : 5,815,008
DATED : September 29, 1998
INVENTOR(S) : Williamson, III et al.

It is certified that error appears in the above-identified patent and that said Letters Patent is hereby corrected as shown below:

Col. 2, line 53, please delete "skied" and insert -- skilled

Col. 4, line 35, please delete "VP" and insert -- Vp

Col. 8, line 20, please delete "IN" and insert -- I/V

Col. 10, line 25, please delete "Schottky-iode" and insert -- Schottky-diode

Signed and Sealed this

Twenty-eighth Day of September, 1999

Attest:

Q. TODD DICKINSON

*Attesting Officer*   *Acting Commissioner of Patents and Trademarks*

UNITED STATES PATENT AND TRADEMARK OFFICE
CERTIFICATE OF CORRECTION

PATENT NO. : 5,815,008
DATED : September 29, 1998
INVENTOR(S) : William Williamson, III; Barry Kent Gilbert, both of Roechester, Minn.

It is certified that error appears in the above-identified patent and that said Letters Patent is hereby corrected as shown below:

At Col. 12, line 60, please delete "implemented by the semiconductor." and insert --implemented by the semiconductor structure.--

Signed and Sealed this

Twenty-sixth Day of October, 1999

*Attest:*

Q. TODD DICKINSON

*Attesting Officer*     Acting Commissioner of Patents and Trademarks